United States Patent [19]
Black et al.

[11] Patent Number: 5,477,192
[45] Date of Patent: Dec. 19, 1995

[54] AMPLIFIER SUITABLE FOR USE IN A RADIOTELEPHONE

[75] Inventors: Gregory R. Black, Vernon Hills, Ill.; Natalino Camilleri, Tempe; David Q. Ngo, Phoenix, both of Ariz.

[73] Assignee: Motorola, Schaumburg, Ill.

[21] Appl. No.: 333,408

[22] Filed: Nov. 2, 1994

Related U.S. Application Data

[63] Continuation-in-part of Ser. No. 166,054, Dec. 13, 1993, Pat. No. 5,410,275.

[51] Int. Cl.[6] ........................................ H03F 3/16
[52] U.S. Cl. ........................................ 330/288; 330/296
[58] Field of Search ........................ 323/315, 316; 330/288, 296, 307, 310; 455/127

[56] References Cited

U.S. PATENT DOCUMENTS

| | | | |
|---|---|---|---|
| 3,986,058 | 10/1976 | Hongu et al. | 307/296 |
| 4,618,815 | 10/1986 | Swanson | 323/315 |
| 4,694,201 | 9/1987 | Jason | 323/315 X |
| 4,896,061 | 1/1990 | Ahmed | 307/575 |
| 4,975,632 | 12/1990 | James et al. | 323/315 |
| 4,990,976 | 2/1991 | Hattori | 357/23.4 |
| 5,027,251 | 6/1991 | Hirota et al. | 361/18 |
| 5,079,456 | 1/1992 | Kotowski et al. | 307/571 |
| 5,126,688 | 6/1992 | Nakanishi et al. | 330/285 |
| 5,142,696 | 8/1992 | Kosiec et al. | 330/288 X |
| 5,160,898 | 11/1992 | Black | 330/284 |
| 5,220,290 | 6/1993 | Black | 330/279 |
| 5,410,275 | 4/1995 | Black | 330/288 |

OTHER PUBLICATIONS

Gregorian, Roubik and Temes, Gabor C., *Analog MOS Integrated Circuits for Signal Processing*, John Wiley & Sons, pp. 126–140.

*Primary Examiner*—Steven Mottola
*Attorney, Agent, or Firm*—Kirk W. Dailey

[57] ABSTRACT

The amplifier (201) uses transistors (401,403) such as MOS-FET transistors in a current mirror configuration. The transistors (401,403) are easy to package as surface mount devices. The drain port of the first transistor is coupled to an output signal (207) and a bias input signal (VB+). A gate port of the first transistor is coupled to a bias control input (117) and the signal input (115). The source of the first transistor and the source of the second transistor are coupled to an electrical ground (409). A first end of a resistive device (411) is coupled to the gate port and the drain port of the second transistor and a second end of the resistive device (411) is coupled the signal input (115) and the bias control input (117). This amplifier (201) has low sensitivity to the variations of the bias current to the control signal threshold, making the amplifier ideal for use in a radiotelephone (103).

11 Claims, 1 Drawing Sheet

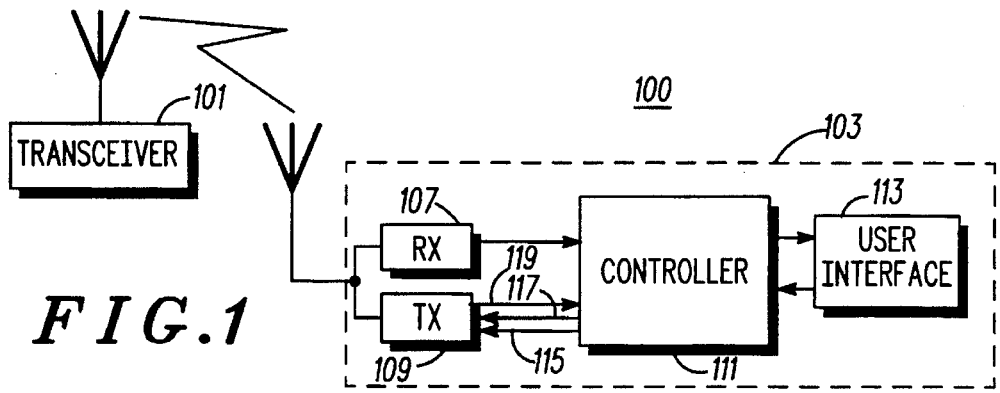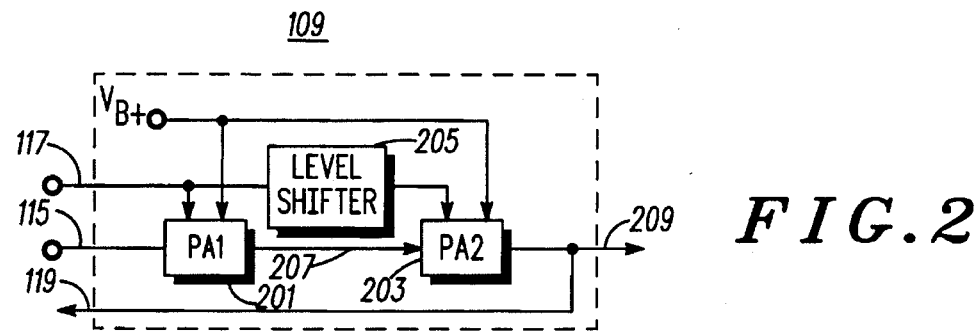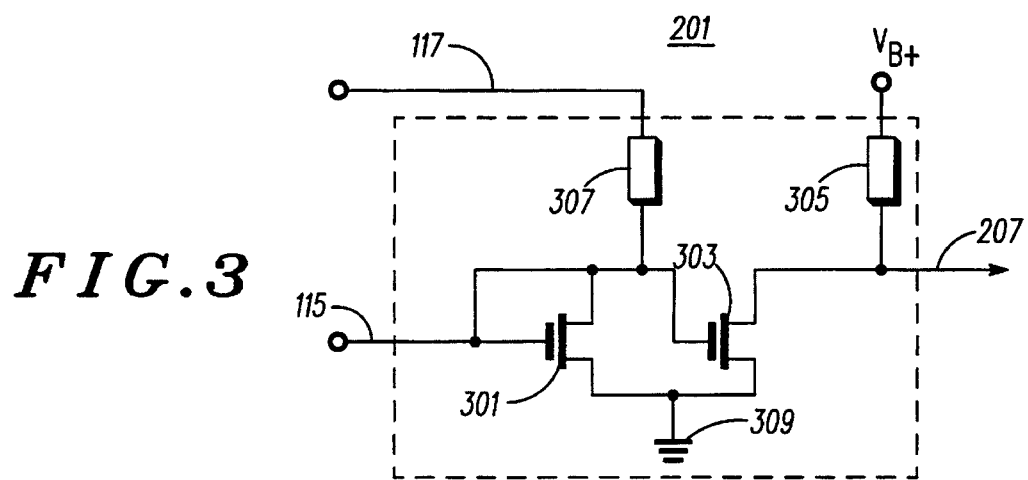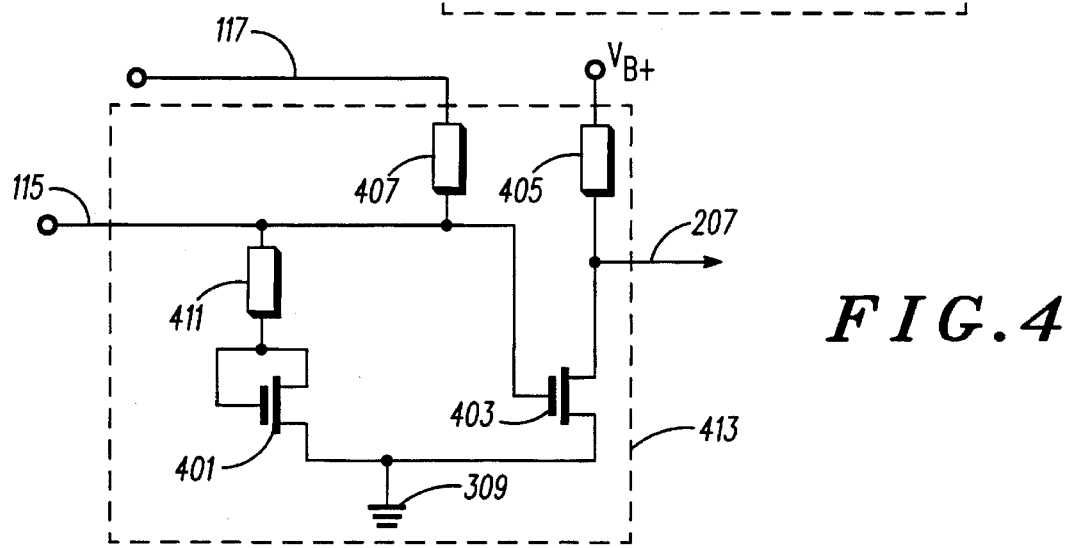

AMPLIFIER SUITABLE FOR USE IN A RADIOTELEPHONE

This is a continuation-in-part of application Ser. No. 08/166,054, filed Dec. 13, 1993, now U.S. Pat. No. 5,410,275.

FIELD OF THE INVENTION

Generally, the present invention relates to amplifiers and more specifically to power amplifiers using transistors such as (metal oxide semiconductor field effect transistor) MOS-FET transistors in a current mirror configuration.

BACKGROUND OF THE INVENTION

In the past, power amplifiers for radio communication devices, such as radiotelephones, have used bipolar transistors. The simplest and most cost effective approach for building the amplifier would be to mount the bipolar transistor die in an industry standard plastic surface mountable package, and soldering the package to a circuit board.

A problem arose which made it impractical to use standard surface mount packaging in many power amplifier applications because bipolar transistors have an output signal and heat sink coming out of one side of the bipolar transistor die, and input signals and RF grounds coming out of the other side of the transistor die. The requirements of providing a low loss electrical path for the output signal and a thermally conductive path for heat dissipation on one side of the die, and low loss electrical paths for the input signal and electrically conductive paths for the RF grounds from the other side of the die necessitated the use of onboard die attachment process and a wirebond process to couple the transistors to a circuit board.

There is a requirement in the design of an amplifier to set the bias current at an optimal level for achieving, among other goals, the required gain, output power and efficiency. Additionally, there is a requirement in radiotelephone applications that the output power is controllable. For good power efficiency it is advantageous to control the output power by varying the bias current. The bias current is responsive to changes in a control voltage signal. The output power control range for each power amplifier stage is limited on the high end by the amplifier gain and on the low end by the isolation from input to output when the control voltage, and hence the bias current, is set to zero. Within this range the output power is approximately proportional to the square of the bias current. A potential problem exists when the bias current can not be held at its optimum value due to extreme sensitivity of bias current to changes in circuit parameters.

In a single stage amplifier, the sensitivity problem can be alleviated by using an output power control loop to automatically compensate for parameter shifts. However, only the final stage of a multi-stage bipolar amplifier could be controlled optimally by an output power control loop. Therefore, a multi-stage amplifier could not be properly biased in every stage at its optimum performance point if the circuit parameters are shifted. Additionally, under extreme parameter variations, the driver stage of the multi-stage amplifier could be damaged by over dissipation caused by too much bias current.

The bias current is exponentially-related to changes in the control voltage when using bipolar transistors. This exponential relationship caused potential problems due to high sensitivity of the bias current to small changes in circuit parameters. Particularly, the bias current is primarily sensitive to changes in the threshold voltage above which the bias current begins to flow. Fortunately, with bipolar transistors, because the thresholds were largely dependent on the built-in potential of a silicon pn junction, the bias current variation due to changes in this parameter was sufficiently low. However, the costly onboard die attach and wire bonding could not be eliminated.

It would be advantageous to have a single stage or a multistage amplifier employing devices which are easy to package, and having the output power controllable by varying the bias current, with low sensitivity of the bias current to control signal threshold variations.

BRIEF DESCRIPTION OF THE DRAWINGS

FIG. 1 is an illustration in block diagram form of a radiotelephone communication system which may employ the current invention.

FIG. 2 is an illustration in block diagram form of a transmitter in accordance with the present invention.

FIG. 3 is a detailed illustration of a power amplifier in accordance with the present invention.

FIG. 4 is a detailed illustration of a power amplifier in accordance with the present invention.

DESCRIPTION OF A PREFERRED EMBODIMENT

FIG. 1 is an illustration in block diagram form of a radiotelephone communication system. The radiotelephone communication system 100 includes a remote transceiver 101 which sends and receives radio frequency (RF) signals to and from radiotelephones within a fixed geographic area. The radiotelephone 103 is one such radiotelephone contained within the geographic area. The radiotelephone 103 includes an antenna 105, a receiver 107, the transmitter 109, a controller 111, and a user interface 113.

Upon reception of RF signals, the radiotelephone 103 receives the RF signals through the antenna 105. The antenna 105 converts the received RF signals into electrical RF signals for use by the receiver 107. The receiver 107 demodulates the electrical RF signals and recovers the data transmitted on the RF signals and outputs the data to the controller 111. The controller 111 formats the data into a recognizable voice or information for use by the user interface 113. The user interface 113 communicates the received information or voice to a user. Typically, the user interface includes a display, a key pad, a speaker and a microphone.

Upon transmission of radio frequency signals from the radiotelephone 103 to the remote transceiver 101, the user interface 113 transmits user input data to the controller 111. The controller 111 typically includes a microprocessor, memory, and a power amplifier control circuit. The controller 111 formats the information obtained from the user interface and transmits it to the transmitter 109 for conversion into RF modulated signals via the data line 115. Additionally, the controller 111 supplies the transmitter 109 with a control signal 117 having a voltage level. The voltage level of the control signal 117 determines the power of the RF signal output from the transmitter 109. In the preferred embodiment, the transmitter 109 contains a multi-stage power amplifier configuration. The voltage of the control signal 117 is determined by a control circuit contained within the controller 111. The control circuit utilizes the power output feedback signal 119 to determine the proper voltage of the control signal 117.

FIG. 2 is an illustration in block diagram form of the transmitter 109, previously illustrated in FIG. 1. Here, the transmitter 109 includes the first power amplifier module 201, a second power amplifier module 203, and a level shifter 205. The data signal 115, output from the controller 111, is input to the first power amplifier module 201. The bias current flowing through the first power amplifier module is linearly related to a control current derived from the voltage of the control signal 117. As previously discussed in U.S. Pat. Nos. 5,220,290 and 5,160,898, both invented by Gregory R. Black, both assigned to the same assignee as the current application, the level shifter 205 shifts the voltage of the control signal 117 by a predetermined amount before inputting the control signal into the second power amplifier module 203. In the preferred embodiment, the voltage of the control signal is shifted down by 0.7 volts. The amplified data output from the first power amplifier module 201 on the output line 207 is input to the second power amplifier module 203. The second power amplifier module 203 has a bias current for controlling the amplification level of the second power amplifier. The second bias current is linearly-related to a second control current. The second control current is derived from the shifted control voltage of the control signal 117 output from the level shifter 205. The second amplified data signal 209 is output from the second power amplifier module 203. The second amplified data signal 209 contains the RF modulated and amplified data for output on the antenna 105 of FIG. 1. Additionally, the second amplified data signal 209 is fed back to the controller 111 of FIG. 1 via the feedback control signal 119. The feedback control signal 119 indicates the power output level from the second power amplifier stage 203 to the power amplifier control circuit contained within the controller 111 of FIG. 1.

In the preferred embodiment, the transistors which are used as the active devices comprising the amplifier modules are n-channel enhancement mode silicon MOSFETs connected in grounded source configurations. The MOSFETs are processed from an electrically conductive silicon wafer such that the source port is connected through the bulk silicon wafer material to the back side of the die. The backside source of the silicon MOSFETs greatly simplifies the package design since the thermal path for eliminating heat can be made large while simultaneously improving the electrical path to ground. The inventors foresee the use of other equally sufficient transistors in this application, such as other field effect transistors (FETs).

More generally, the circuits employed in the preferred embodiment are also possible in any integrated circuit process in which multiple field effect transistors, FET's, can be built on a single die with insulated gates and drains. In particular, an alternative embodiment is to employ the proposed circuits using Galium Arsenide, GaAs, Metel-Semiconductor Field Effect Transistors, MESFET's. GaAs MESFET processes employ bulk GaAs wafer material which is substantially insulating such that all of the electrical connections must be made through the top side, and the thermal path for removing heat can be made through the bottom side without effecting the electrical connections.

With FETs, the bias current is proportional to the transconductance parameter, $\beta$, and to the square of the difference of the gate voltage, Vg, and a threshold voltage, Vt.

$$Id=(\beta/2)*[(Vg-Vt)]^2$$

Because of the square-law relationship between the gate voltage and the threshold voltage, there is a potential for the amplifier bias current to change severely due to variations in the Vt. Unlike the case of bipolar transistors, where the threshold voltage is dependent on intrinsic properties of silicon, the FET threshold voltage is dependent on doping concentrations which can vary with processing. The variation of Vt is typically specified as ±50%. The sensitivity of Id to changes in Vt is calculated as follows:

$$Svt = \partial(Id)/\partial(Vt)$$
$$= \beta*(Vg+Vt)$$

The sensitivity increases as the control voltage, Vg, increases. There are several approaches to solving the problem of inaccurate bias current due to threshold variations. First, one could design the amplifier such that the many of the key attributes such as gain and output power have sufficient margin to withstand the threshold variations. Second, one could grade the devices according to the measured threshold and employ a different biasing resistor kit for each grade of device. Third, one could adjust the biasing resistors using trimming techniques during the module assembly. Finally, the preferred approach is to employ a current mirror in the bias circuit which is configured as shown in the FIG. 201. Denoting the ratio of the gate lengths of the first transistor 301 and the second transistor 303 as K, the resistive element 307 as Rset, and the control voltage as Vref, then the bias current of the first transistor, Id, is approximately given by the following expression.

$$Id=K*(Vref-Vt)/Rset$$

The linear relationship between Id and Vref is the reason why the mirrored arrangement makes the bias current less sensitive to variations in threshold voltage. In this case the sensitivity remains constant as the control voltage increases, and is therefore smaller than before at high control voltages.

$$Svt = \partial(Id)/\partial(Vt)$$
$$= K/Rset$$

FIG. 3 is a detailed illustration of the power amplifier module 201 of FIG. 2. In the preferred embodiment, the second power amplifier module 203 is identical to the first power amplifier module 201, except that the device sizes and bias setting resistors are scaled according to the peak output power requirements for each stage. Alternatively, the second power amplifier could employ a FET device without the current mirror, albeit with higher bias variations in the first stage due to threshold mismatch between stages, since the output power control loop sets the control voltage for the optimum bias point of the output stage.

For ease of illustration, only the first power amplifier module 201 will be illustrated. The first power amplifier module 201 contains a first transistor 301 having a drain, a source and a gate, a second transistor having a drain, a source and a gate, a first resistive element 307 and a first inductive device 305 and an electrical ground 309 all mounted on a die 313. The data input signal 115 is coupled to the gate of the first transistor 301. The control signal 117 is coupled to the drain and the gate of the first transistor and the gate of the second transistor 303 through the first resistive device 307. In the preferred embodiment, the first resistive device 307 is a resistor having a value of 510Ω. The source of the first transistor 301 is coupled to the source of the second transistor 303, which are coupled to an electrical ground 309. The drain of the second transistor is coupled to a bias voltage $V_{B+}$ through a first inductive device 305. In the preferred embodiment, a first inductive device 305 is an inductor having a value of 39 nH. Alternatively, the first inductive device could be a transmission line comprised of signal and ground traces on a multi-layer printed circuit board. The drain of the second transistor is also coupled to the amplified data output signal 207.

Alternatively, the mirror in the bias circuit could be connected to the gate through a resistive element 411 as shown in FIG. 4. FIG. 4 is an illustration of this alternative embodiment of the present invention. The circuit illustrated in FIG. 4 is similar to the circuit illustrated in FIG. 3. The circuit includes transistor 401, transistor 403, inductive element 405, a first resistive element 407, electrical ground 409, a second resistive element 411 and a die 413. If we represent the resistive element 411 as Rd and the resistive element 407 as Rset, then the voltage on the gate of the first transistor 401, Vg, is approximately given by the following expression.

$$Vg = Vt + \{(Vref - Vt) * [Rd/(Rset + Rd)]\}$$

Substituting this expression for Vg into the general expression for FET drain current yields the following expression for the drain current in the first transistor, Id.

$$Id = (\beta/2) * \{(Vg - Vt) * [Rd/(Rset + Rd)]\}^2$$

The sensitivity of drain current, Id, with variations in threshold voltages for the configuration with the mirror connected by a resistor is given by the following expression.

$$\begin{aligned} Svt &= \partial(Id)/\partial(Vt) \\ &= [\beta * (Vg + Vt)] * [Rd/(Rset + Rd)] \, 2 \end{aligned}$$

The sensitivity differs by a factor of $[Rd/(Rset+Rd)]^2$ to the sensitivity in the un-mirrored configuration. Since this factor is always less than 1, the sensitivity of drain current to changes in threshold voltage of the alternative mirrored configuration is improved.

What is claimed is:

1. An amplifier including a bias control port, a bias port, an input port and an output port, the input port for receiving an input signal having an input power level, the output port for emitting an output signal having an output power level, the bias control port for receiving a bias control signal having a control current, the bias port for receiving a bias current, the amplifier comprising:

a first transistor having a first drain port, a first source port, a first gate port and a first threshold voltage, the first drain port coupled to the signal output and the bias input, the first gate port coupled to the bias control input and the signal input;

a second transistor having a second drain port, a second source port, a second gate port and a second threshold voltage, the first source and the second source are coupled to an electrical ground, the first threshold voltage and the second threshold voltage are substantially equal; and a first resistive device having a first and a second end, the first end coupled to the second gate port and the second drain port and the second end coupled to the signal input and the bias control input.

2. An amplifier in accordance with claim 1 wherein the bias control input is coupled to the first gate port, and the first resistive device through a second resistive device.

3. An amplifier in accordance with claim 1 wherein the bias input is coupled to the first drain port through a first inductive device.

4. An amplifier in accordance with claim 1 wherein the bias input is coupled to the first drain port through a first transmission line.

5. An amplifier in accordance with claim 1 wherein the first transistor and the second transistor are disposed on a first die in which the bulk wafer material is electrically conductive, and the first source and the second source are connected to the bulk wafer material.

6. An amplifier in accordance with claim 1 wherein the first transistor and the second transistor are disposed on a first die in which the bulk wafer material is at least substantially electrically insulating.

7. A multi-stage amplifier circuit comprising:

a first control signal having a control voltage;

a first transistor amplifier stage having a first bias current, a first control current and a first threshold voltage, the first control current derived from the control voltage and the first threshold voltage, the first bias current linearly related to the first control current, the first transistor amplifier stage comprising:

a first transistor having a first drain port, a first source port, a first gate port and a first threshold voltage, the first drain port coupled to the signal output and the bias input, the first gate port coupled to the bias control input and the signal input, a second transistor having a second drain port, a second source port, a second gate port and a second threshold voltage, the first source and the second source are coupled to an electrical ground, the first threshold voltage and the second threshold voltage are substantially equal, and a first resistive device having a first and a second end, the first end coupled to the second gate port and the second drain port and the second end coupled to the signal input and the bias control input; and a second transistor amplifier stage having a second bias current, a second control current and a third threshold voltage, the second control current derived from the control voltage and the third threshold voltage.

8. A multi-stage amplifier in accordance with claim 7 wherein the second transistor amplifier stage further comprises:

a first transistor having a first drain port, a first source port, a first gate port and a first threshold voltage, the first drain port coupled to the signal output and the bias input, the first gate port coupled to the bias control input and the signal input;

a second transistor having a second drain port, a second source port, a second gate port and a second threshold voltage, the first source and the second source are coupled to an electrical ground, the first threshold voltage and the second threshold voltage are substantially equal, such that the output power level is related to the input power level and the bias current is linearly related to the control current; and a first resistive device having a first and a second end, the first end coupled to the second gate port and the second drain port and the second end coupled to the signal input and the bias control input.

9. A radiotelephone comprising:

a controller for generating a first control signal having a control voltage;

a transmitter comprising:

a first transistor amplifier stage having a first bias current, a first control current and a first threshold voltage, the first control current derived from the control voltage and the first threshold voltage, the first bias current linearly related to the first control current, the first transistor amplifier stage further comprises:

a first transistor having a first drain port, a first source port, a first gate port and a first threshold voltage, the first drain port coupled to the signal output and the bias input, the first gate port coupled to the bias control input and the signal input, a second transistor having a second drain port, a second source port, a second gate port and a second threshold voltage, the first source and the second source are coupled to an electrical ground, the first threshold voltage and the second threshold voltage are substantially equal, and a first resistive device having a first and a second end, the first end coupled to the second gate port and the second drain port and the second end coupled to the signal input and the bias control input; and a second transistor amplifier stage having a second bias current, a second control current and a third threshold voltage, the second control current derived from the control voltage and the second threshold voltage.

10. A radiotelephone in accordance with claim 9 wherein the second bias current is linearly related to the second control current.

11. A radiotelephone in accordance with claim 9 wherein the second transistor amplifier stage further comprises:

a first transistor having a first drain port, a first source port, a first gate port and a first threshold voltage, the first drain port coupled to the signal output and the bias input, the first gate port coupled to the bias control input and the signal input;

a second transistor having a second drain port, a second source port, a second gate port and a second threshold voltage, the first source and the second source are coupled to an electrical ground, the first threshold voltage and the second threshold voltage are substantially equal; and a first resistive device having a first and a second end, the first end coupled to the second gate port and the second drain port and the second end coupled to the signal input and the bias control input.

* * * * *